(12) United States Patent
Pillarisetty et al.

(10) Patent No.: US 9,461,141 B2
(45) Date of Patent: Oct. 4, 2016

(54) CONTACT TECHNIQUES AND CONFIGURATIONS FOR REDUCING PARASITIC RESISTANCE IN NANOWIRE TRANSISTORS

(71) Applicant: Intel Corporation, Santa Clara, CA (US)

(72) Inventors: Ravi Pillarisetty, Portland, OR (US); Benjamin Chu-Kung, Hillsboro, OR (US); Willy Rachmady, Beaverton, OR (US); Van H. Le, Beaverton, OR (US); Gilbert Dewey, Hillsboro, OR (US); Niloy Mukherjee, Beaverton, OR (US); Matthew V. Metz, Portland, OR (US); Han Wui Then, Portland, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/831,307

(22) Filed: Aug. 20, 2015

(65) Prior Publication Data

US 2016/0035860 A1     Feb. 4, 2016

Related U.S. Application Data

(62) Division of application No. 13/997,897, filed as application No. PCT/US2011/067667 on Dec. 28, 2011, now Pat. No. 9,123,790.

(51) Int. Cl.
*H01L 21/336*     (2006.01)
*H01L 29/66*     (2006.01)
(Continued)

(52) U.S. Cl.
CPC ....... *H01L 29/66477* (2013.01); *H01L 23/485* (2013.01); *H01L 29/0673* (2013.01);
(Continued)

(58) Field of Classification Search
None
See application file for complete search history.

(56) References Cited

U.S. PATENT DOCUMENTS 5,965,914 A     10/1999  Miyamoto
2011/0014754 A1   1/2011  Park et al.
(Continued)

FOREIGN PATENT DOCUMENTS

| KR | 10-20080051030 A | 6/2008 |
| TW | 200849589 A | 12/2008 |
| TW | 201001563 A1 | 1/2010 |

OTHER PUBLICATIONS

International Search Report and Written Opinion mailed Jul. 18, 2012 for International Application No. PCT/US2011/067667, 9 pages.

(Continued)

*Primary Examiner* — Daniel Whalen
(74) *Attorney, Agent, or Firm* — Schwabe, Williamson & Wyatt, P.C.

(57) ABSTRACT

Embodiments of the present disclosure provide contact techniques and configurations for reducing parasitic resistance in nanowire transistors. In one embodiment, an apparatus includes a semiconductor substrate, an isolation layer formed on the semiconductor substrate, a channel layer including nanowire material formed on the isolation layer to provide a channel for a transistor, and a contact coupled with the channel layer, the contact being configured to surround, in at least one planar dimension, nanowire material of the channel layer and to provide a source terminal or drain terminal for the transistor.

10 Claims, 4 Drawing Sheets

(51) Int. Cl.
*H01L 29/423* (2006.01)
*H01L 29/786* (2006.01)
*H01L 29/06* (2006.01)
*H01L 23/485* (2006.01)
*H01L 29/775* (2006.01)
*H01L 29/78* (2006.01)
*B82Y 99/00* (2011.01)
*B82Y 40/00* (2011.01)

(52) U.S. Cl.
CPC ....... *H01L29/42392* (2013.01); *H01L 29/775* (2013.01); *H01L 29/78696* (2013.01); *B82Y 40/00* (2013.01); *B82Y 99/00* (2013.01); *H01L 2029/7858* (2013.01); *H01L 2924/0002* (2013.01); *Y10S 977/762* (2013.01); *Y10S 977/89* (2013.01)

(56) References Cited

U.S. PATENT DOCUMENTS

2011/0108803 A1   5/2011   Deligianni et al.
2013/0313513 A1*  11/2013  Cappellani ........ H01L 21/02587
                                              257/9

OTHER PUBLICATIONS

Office Action mailed Aug. 26, 2014 for Taiwan Patent Application No. 101145428, 18 pages.
International Preliminary Report on Patentability received for International Application No. PCT/US2011/067667, dated Jul. 10, 2014, 6 pages.
Non-Final Office Action mailed Jan. 30, 2015, issued in corresponding U.S. Appl. No. 13/997,897.
Notice of Allowance mailed May 8, 2015, issued issued in corresponding U.S. Appl. No. 13/997,897.

* cited by examiner

CONTACT TECHNIQUES AND CONFIGURATIONS FOR REDUCING PARASITIC RESISTANCE IN NANOWIRE TRANSISTORS

CROSS REFERENCE TO RELATED APPLICATIONS

This application claims priority to U.S. patent application Ser. No. 13/997,897, filed Jun. 25, 2013, entitled "CONTACT TECHNIQUES AND CONFIGURATIONS FOR REDUCING PARASITIC RESISTANCE IN NANOWIRE TRANSISTORS", which is a national phase entry under 35 U.S.C. §371 of International Application No. PCT/US2011/067667, filed Dec. 28, 2011, entitled "CONTACT TECHNIQUES AND CONFIGURATIONS FOR REDUCING PARASITIC RESISTANCE IN NANOWIRE TRANSISTORS", which designated, among the various States, the United States of America, the entire contents of which are hereby incorporated by reference.

TECHNICAL FIELD

Embodiments of the present disclosure generally relate to the field of integrated circuits, and more particularly, to contact techniques and configurations for reducing parasitic resistance in nanowire transistors

BACKGROUND

Integrated circuit devices including, tier example, processors and/or memory devices continue to scale to smaller sizes. The shrinking of transistor sizing and/or spacing may increase parasitic external resistance (Rext), which may adversely affect performance of such devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
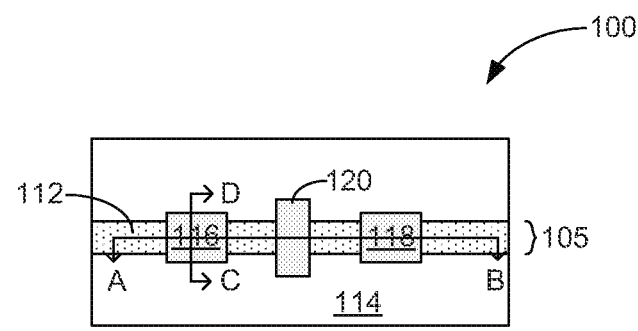
FIG. 1 schematically illustrates a top view of an integrated circuit device.

Embodiments of the present disclosure provide contact techniques and configurations for reducing parasitic resistance in nanowire transistors. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed or deposited on a second layer," may mean that the first layer is formed or deposited over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

According to various embodiments, the present disclosure describes an apparatus including a semiconductor substrate, an isolation layer formed on the semiconductor substrate, a channel layer including nanowire material formed on the isolation layer to provide a channel for a transistor and a contact coupled with the channel layer, the contact being configured to surround, in at least one planar dimension, nanowire material of the channel layer and to provide a source terminal or drain terminal for the transistor.

In some embodiments, the at least one planar dimension is substantially perpendicular to a planar surface of the semiconductor substrate upon which the transistor is formed. The apparatus may further include an epitaxial film disposed on and epitaxially coupled with the channel layer, the epitaxial film being configured to surround, in the at least one planar dimension, the nanowire material of the channel layer and being disposed between the nanowire material of the channel layer and material of the contact.

In some embodiments, the nanowire material of the channel layer includes N-type or P-type semiconductor material and the epitaxial film includes a group III-V semiconductor material and has a thickness from 50 Angstroms to 1000 Angstroms.

In some embodiments, the channel layer is epitaxially coupled with the isolation layer, the nanowire material of the channel layer includes germanium (Ge), the epitaxial film includes a P-type semiconductor material selected from the group consisting of silicon germanium (SiGe), germanium (Ge), and germanium antimonide (GeSb), and the isolation layer includes silicon germanium (SiGe).

In some embodiments, the isolation layer is a first isolation layer and the channel layer is a first channel layer. The apparatus may further include a second isolation layer formed on the first channel layer and a second channel layer including nanowire material formed on the second isolation layer, wherein the contact is coupled with the second channel layer and configured to surround, in the at least one planar dimension, the nanowire material of the second channel layer.

In some embodiments, the contact is a source terminal. The apparatus may further include a drain terminal coupled with the first channel layer and the second channel layer, the drain terminal being configured to surround, in the at least one planar dimension, nanowire material of the first channel layer and nanowire material of the second channel layer and a gate coupled with the first channel layer and the second channel layer, the gate being disposed between the source terminal and the drain terminal and configured to control current flow of the transistor between the source terminal and the drain terminal.

In some embodiments, the semiconductor substrate includes silicon (Si) and the drain terminal and the source terminal includes a metal. The apparatus may further include interlayer dielectric (ILD) formed on the second channel layer. The apparatus may further include a buffer layer formed on the semiconductor substrate, wherein the buffer layer is disposed between the semiconductor substrate and the isolation layer.

According to various embodiments, the present disclosure describes a method including providing a semiconductor substrate, depositing an isolation layer on the semiconductor substrate, depositing a channel layer on the isolation layer, the channel layer to provide a channel for a transistor and forming a contact coupled with the channel layer, the contact being configured to surround, in at least one planar dimension, material of the channel layer and to provide a source terminal or drain terminal for the transistor. In some embodiments, the at least one planar dimension is substantially perpendicular to a planar surface of the semiconductor substrate upon which the transistor is formed.

The method may further include depositing a buffer layer on the semiconductor substrate, wherein the buffer layer is disposed between the semiconductor substrate and the isolation layer. In some embodiments, depositing the channel layer comprises epitaxially depositing the channel layer on the isolation layer. In some embodiments, forming the contact includes selectively removing material of the isolation layer using an etch process and depositing a metal to replace the selectively removed material of the isolation layer to form the contact. In some embodiments, forming the contact further includes epitaxially depositing an epitaxial on the channel layer prior to depositing the metal to form the contact, the epitaxial film being configured to surround, in the at least one planar dimension, the material of the channel layer and being disposed between the material of the channel layer and material of the contact.

In some embodiments, the epitaxial film includes a P-type material, the material of the channel layer includes germanium (Ge) nanowire material and the isolation layer includes silicon germanium (SiGe).

In some embodiments, the isolation layer is a first isolation layer and the channel layer is a first channel layer. The method may further include depositing a second isolation layer on the first channel layer and depositing a second channel layer on the second isolation layer, wherein the contact is coupled with the second channel layer and configured to surround, in the at least one planar dimension, material of the second channel layer.

In some embodiments, the contact is a source terminal. The method may further include forming a drain terminal coupled with the first channel layer and the second channel layer, the drain terminal being configured to surround, in the at least one planar dimension, material of the first channel layer and material of the second channel layer and forming a gate coupled with the first channel layer and the second channel layer, the gate being disposed between the source terminal and the drain terminal and configured to control current flow of the transistor between the source terminal and the drain terminal. In some embodiments, the method may include depositing an interlayer dielectric (ILD) on the second channel layer.

According to various embodiments, the present disclosure describes a system including a processor and a memory device coupled with the processor, the processor or the memory device including a semiconductor substrate an isolation layer formed on the semiconductor substrate a channel layer including nanowire material formed on the isolation layer, the channel layer to provide a channel for a transistor and a contact coupled with the channel layer, the contact being configured to surround, in at least one planar dimension, nanowire material of the channel layer and to provide a source terminal or drain terminal for the transistor. In some embodiments, the at least one planar dimension is substantially perpendicular to a planar surface of the semiconductor substrate upon which the transistor is formed.

The system may further include an epitaxial film disposed on and epitaxially coupled with the channel layer, the epitaxial film being configured to surround, in the at least one planar dimension, the nanowire material of the channel layer and being disposed between the nanowire material of the channel layer and material of the contact.

In some embodiments, the nanowire material of the channel layer includes N-type or P-type semiconductor material and the epitaxial film includes a group III-V semiconductor material and has a thickness from 50 Angstroms to 1000 Angstroms.

In some embodiments, the channel layer is epitaxially coupled with the isolation layer, the nanowire material of the channel layer includes germanium (Ge), the epitaxial film includes a P-type semiconductor material selected from the group consisting of silicon germanium (SiGe), germanium (Ge), and germanium antimonide (GeSn) and the isolation layer includes silicon germanium (SiGe).

In some embodiments, the isolation layer is first isolation layer and the channel layer is a first channel layer. The system may further include a second isolation layer formed on the first channel layer and a second channel layer including nanowire material formed on the second isolation layer, wherein the contact is coupled with the second channel layer and configured to surround, in the at least one planar dimension, the nanowire material of the second channel layer.

In some embodiments, the contact is a source terminal. The system may further include a drain terminal coupled with the first channel layer and the second channel layer, the drain terminal being configured to surround, in the at least one planar dimension, nanowire material of the first channel layer and nanowire material of the second channel layer and a gate coupled with the first channel layer and the second channel layer, the gate being disposed between the source terminal and the drain terminal and configured to control current flow of the transistor between the source terminal and the drain terminal.

In some embodiments, the semiconductor substrate includes silicon (Si), the drain terminal includes a metal, the source terminal includes a metal and the gate includes a metal. In some embodiments, the system further includes a buffer layer formed on the semiconductor substrate, wherein the buffer layer is disposed between the semiconductor substrate and the isolation layer. In some embodiments, the system is a handheld computing device, a tablet, or a smartphone.

FIG. 1 schematically illustrates a top view of an integrated circuit (IC) device 100. The IC device 100 may include one or more tin structures (hereinafter "fin structure 105") formed on a semiconductor substrate (e.g., semiconductor substrate 102 of FIG. 2). The fin structure 105 may include, for example, a stack of layers (e.g., first channel layer 108, second isolation layer 110, and second channel layer 112) deposited to form one or more transistors of the IC device 100. For example, the IC device 100 may include contacts formed to provide a source terminal 116 and/or a drain terminal 118 of one or more transistors. A gate 120 may be formed to control current flow through a channel layer (e.g., second channel layer 112) of the transistor(s) between the source terminal 116 and the drain terminal 118.

An electrically insulative material such as interlayer dielectric (ILD) material 114 may be deposited to isolate components of the IC device 100. In the depicted top view of FIG. 1, ILD material 114 that may cover portions of the fin structure 105 is not shown to avoid obscuring underlying features.

Figure 2:
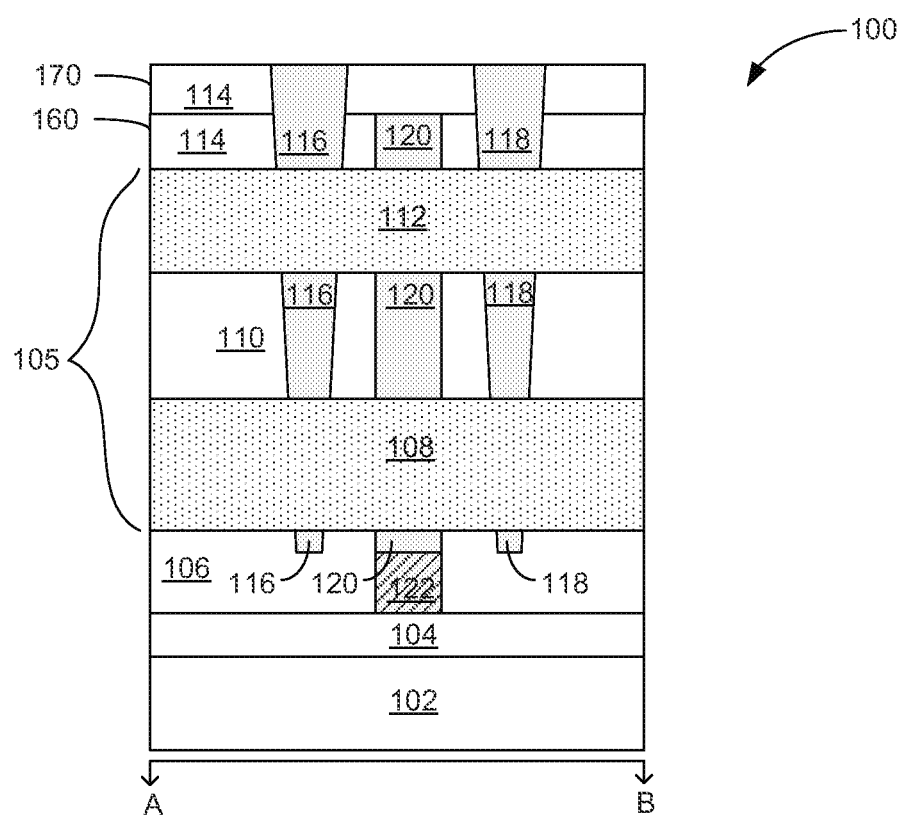
FIG. 2 schematically illustrates a cross-section side view along a fin structure of the integrated circuit device, in accordance with some embodiments.

FIG. 2 schematically illustrates a cross-section side view along a fin structure of the IC device 100, in accordance with some embodiments. For example, the cross-section side view may represent a view along line AB of FIG. 1. In some embodiments, the fin structure 105 includes at least two channel layers electrically insulated from one another by an isolation layer (e.g., first channel layer 108, second isolation layer 110, and second channel layer 112). The fin structure 105 may additionally include one or more buffer layers 104, a first isolation layer 106, and/or portions of the semiconductor substrate 102, in some embodiments. In some embodiments where the IC device 100 does not include multiple channel layers, the fin structure 105 may include only the first channel layer 108 or the first isolation layer 106 and the first channel layer 108.

The IC device 100 may be formed on a semiconductor substrate 102. The semiconductor substrate 102 may include silicon in some embodiments. For example, the semiconductor substrate 102 may include N-type or P-type (100) off-oriented silicon, the crystalline directions of the semiconductor substrate 102 being symbolized by the convention (xyz), where x, y, and z represent respective crystallographic planes in three dimensions that are perpendicular to one another. The semiconductor substrate 102 may, for example, include material of a (100) direction off-cut in a range between about 2 degrees to about 8 degrees towards a (110) direction. Other off-cut orientations or a semiconductor substrate 102 without an off-cut orientation may be used. Off-cutting may eliminate anti-phase boundaries. The semiconductor substrate 102 may have a high resistivity between about 1 Ω-cm to about 50 kΩ-cm. The semiconductor substrate 102 may include other materials in other embodiments.

The semiconductor substrate 102 may be a crystalline substrate formed using a bulk silicon or a silicon-on-insulator substructure. In other implementations, the semiconductor substrate 102 may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the semiconductor substrate 102 may be formed are described here, any material that may serve as a foundation upon which a semiconductor device may be built falls within the spirit and scope of the present invention. The semiconductor substrate 102 may include other materials in other embodiments. In some embodiments, the semiconductor substrate 102 is part of a singulated die of a wafer.

In some embodiments, one or more buffer layers (e.g., hereinafter "buffer layer 104") may be formed on the semiconductor substrate 102. The buffer layer 104 may, for example, fill terraces of the semiconductor substrate 102 with atomic bi-layers of a semiconductor material including, for example, one or more group III-V semiconductor materials and/or one or more group II-VI semiconductor materials, or combinations thereof. In some embodiments, the buffer layer 104 may provide a virtual polar semiconductor substrate 102. The buffer layer 104 may further serve as a buffer against dislocation threading and/or provide control of a lattice mismatch (e.g., stress relaxation between the semiconductor substrate 102 and other layers e.g., first isolation layer 106). The buffer layer 104 may include N-type or P-type material systems. In an embodiment, the buffer layer 104 includes gallium arsenide (GaAs). The buffer layer 104 may be epitaxially deposited. In an embodiment, the one or more buffer films are deposited by an epitaxial deposition process. An epitaxial deposition process may include, for example, molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A stack of layers may be formed on the semiconductor substrate 102. For example, a first isolation layer 106 may be formed on the semiconductor substrate 102 (e.g., on buffer layer 104), a first channel layer 108 may be formed on the first isolation layer 106, a second isolation layer 110 may be formed on the first channel layer 108, and a second channel layer 112 may be formed on the second isolation layer 110. The first isolation layer 106, the first channel layer 108, the second isolation layer 110, and the second channel layer 112 may be formed by an epitaxial deposition process. In some embodiments, the layers 106, 108, 110, and 112 are in direct contact, as depicted. The first isolation layer 106 may be in direct contact with the semiconductor substrate 102 in embodiments where a buffer layer 104 is not used.

The first channel layer 108 may provide a channel for a first transistor and the second channel layer 112 may provide a channel for a second transistor of a stacked multi-transistor configuration. For example, when the IC device 100 is in operation, current may be evenly injected from a source terminal 116 through the first and/or second channel layer 108, 112 to the drain terminal 118 based on a voltage applied by gate 120 to the first and/or second channel layer 108, 112.

The first channel layer 108 and the second channel layer 112 may include a variety of suitable materials including N-type and/or P-type material systems. In some embodiments, the first and second channel layers 108, 112 may include a semiconductor material such as, for example, germanium, silicon, a group IV, III-V, or II-VI semiconductor material, or similar channel material. The material of the first and second channel layers 108, 112 may include nanowire materials. In some embodiments, the materials for the first and/or second channel layers 108, 112 may include material systems including gallium (Ga), arsenic (As), Indium (In), antimony (Sb), germanium (Ge), silicon (Si), and the like, or combinations thereof. For example, the first and/or second channel layers 108, 112 may include germanium (Ge), silicon germanium (SiGe), indium antimonide (InSb), antimonide (GaSb), indium antimonide (InGaSb), gallium arsenide (GaAs), indium gallium arsenide (InGaAs), the like, or combinations thereof. In one embodiment, the first channel layer 108 is formed using a group III-V semiconductor material such as gallium arsenide (GaAs) nanowire material and the second channel layer 112 is formed using germanium (Ge) nanowire material. The material of the first and/or second channel layers 108, 112 may have a smatter band gap than material of the first and/or second isolation layers 106, 110. Other suitable channel materials may be used in other embodiments.

The first isolation layer 106 and the second isolation layer 110 may provide an electrically insulative barrier for the first channel layer 108 and the second channel layer 112. According to various embodiments, the first and second isolation layers 106, 110 include a material that is electrically insulative relative to the material of the first and second channel layers 108, 112. The material deposited to form the isolation layers 106, 110 may include, for example, group IV, group III-V, or group II-VI semiconductor materials and/or other electrically insulative materials such as silicon oxide ($SiO_2$) and the like. For example, in some embodiments, the material of the first and/or second isolation layers 106, 110 may include $SiO_2$, aluminum (Al), arsenic (As), gallium (Ga), antimony (Sb), Indium (In), and/or combinations thereof. In embodiments where Ge, SiGe, or GaAs is used for the channel first and/or second channel layers 108, 112), aluminum arsenide (AlAs) or aluminum gallium arsenide (AlGaAs) may be used for isolation (e.g., first and/or second isolation layers 106, 110). In embodiments where InSb, InGaSb, or GaSb are used for the channel, indium aluminum antimonide (InAlSb) may be used for the isolation. In embodiments where InGaAs is used for the channel, indium aluminum arsenide (InAlAs) may be used for the isolation. Other or additional material may be used in other embodiments.

The material for the isolation layers 106, 110 may be selected based on lattice-matching to adjacent layers, electrical isolation properties, and/or etch selectivity for an etching process that forms the contacts (e.g., 116, 118) or gate (e.g., 120). For example, a material may be selected that allows etching of the material of the isolation layers 106, 110, but not the channel layers 108, 112. For example, in one embodiment, AlAs is selected for the isolation layers 106, 110 when GaAs and/or Ge nanowire materials are used for the channel layers 108, 112.

In some embodiments, the layers 104, 106, 108, 110, 112 may each be composed of multiple layers or films (not shown). For example, the isolation layers 106, 108 or the channel layers 108, 112 may each have a first material layer deposited that provides lattice-matching such that the first material can be epitaxially deposited on an underlying layer, a second material layer that provides greater channel/isolation performance than the first material layer, and/or a third material layer that provides lattice-matching such that material of another layer may be epitaxially deposited on the third material layer. The components material layers of the layers 104, 106, 108, 1110, 112 may be selected for other characteristics such as, for example, etch selectivity in some embodiments. More or fewer material layers than described can be used in each of the layers 104, 106, 108, 110, 112 in other embodiments.

A gate stack (hereinafter "gate 120") may be electrically coupled with the first channel layer 108 and the second channel layer 112 in some embodiments. The gate 120 may be configured to control current flow in the second channel layer 112 between the source terminal 116 and the drain terminal 118. The gate 120 may be further configured to control current flow in the first channel layer 108 between the source terminal 116 and the drain terminal 118. The gate 120 may be capacitively coupled with the first and/or second channel layers 108, 112. The gate 120 may include at least two layers, agate dielectric layer and agate electrode layer. The gate dielectric layer may be formed of a material such as silicon dioxide (SiO2) or a high-k material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of two or more metal layers, where at least one metal layer is a workfunction metal layer and at least one metal layer is a metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In implementations of the invention, a pair of spacers brackets the gate stack. The spacers may be formed from a material such as silicon nitride, silicon oxide, silicon carbide, silicon nitride doped with carbon, and silicon oxynitride. Processes for forming spacers are well known in the art and generally include deposition and etching process steps.

A gate insulator 122 may be disposed between the gate 120 and the semiconductor substrate 102, as can be seen, to electrically isolate the gate 120 and avoid potential creation of a paretic planar-type device at the bottom of the gate 120 nearest the semiconductor substrate 102. In some embodiments, the gate insulator 122 includes $SiO_2$. The gate insulator 122 may be composed of other suitable materials in other embodiments.

The source terminal 116 and the drain terminal 118 may be coupled in direct contact with both the first and second channel layers 108, 112. The source terminal 116 may be a voltage-source-source (Vss) contact in some embodiments. The drain terminal 118 may be a voltage-drain-drain (Vdd) contact in some embodiments.

Source and drain regions corresponding with the source terminal 116 and the drain terminal 118 may be formed adjacent to the gate 120. The source and drain regions may be formed using either an implantation/diffusion process or an etching/deposition process. In the former process, dopants such as boron, aluminum, antimony, phosphorous, or arsenic may be ion-implanted into the substrate to form the source and drain regions. The ion implantation process is typically followed by an annealing process that activates the dopants and causes them to diffuse. In the latter process, materials of the stack of layers may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in situ with dopants such as boron, arsenic, or phosphorous. In further implementations, alternate materials may be deposited into the recesses to form the source and drain regions, such as germanium or a group III-V material or alloy.

In some embodiments, the source terminal 116 and the drain terminal 118 may include any suitable electrically conductive material including, for example, metal. In some embodiments, the source terminal 116 and the drain terminal 118 may include copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. In some embodiments, the source terminal 116 and the drain terminal 118 may include a metal nitride such as, for example, titanium nitride (TiN), tungsten nitride (WN), or tantalum nitride (TaN), or combinations thereof. In some embodiments, the source terminal 116 and the drain terminal 118 may include a metal silicide such as, for example, titanium silicide (TN), tungsten silicide (WSi), tantalum silicide (TaSi), cobalt silicide (CoSi), platinum silicide (PtSi), nickel silicide (NiSi), or combinations thereof. In some embodiments, the source terminal 116 and the drain terminal 118 may include a metal silicon nitride such as, for example, titanium silicon nitride (TiSiN), or tantalum silicon nitride (TaSiN), or combinations thereof. In some embodiments, the source terminal 116 and the drain terminal 118 may include a metal carbide such as, for example, titanium carbide (TiC), zirconium carbide (ZrC), tantalum carbide (TaC), hafnium carbide (HfC), or aluminum carbide (AlC), or combinations thereof. In some embodiments, the source terminal 116 and the drain terminal 118 may include a metal carbon nitride such as, for example, tantalum carbon nitride (TaCN), titanium carbon nitride (TiCN), or combinations thereof. In some embodiments, the source terminal 116 and the drain terminal 118 may include conductive metal oxides (e.g., ruthenium oxide). In some embodiments, multiple layers of different materials may be used to form the source terminal 116 and the drain terminal 118. The source terminal 116 and the drain terminal 118 may include other suitable materials in other embodiments.

In some embodiments, the gate 120 may have a more rectangular shaped profile relative to the contacts (e.g., source terminal 116 and drain terminal 118). That is, in some embodiments, the source terminal 116 and drain terminal 118 may have a profile that is more tapered relative to a profile attic gate 122, as depicted. The profile of the gate 122 may be more rectangular as a result of a patterning process that may be used to form the gates 122. For example, a replacement metal gate (RMG) process may be used to form the gates 122 such that a dummy gate is first formed using a sacrificial material that is subsequently removed and replaced with another gate material. The source terminal 116 and the drain terminal 118 may be formed using conventional patterning that does not use a dummy contact or sacrificial material to form the trenches for the contacts.

One or more interlayer dielectrics (ILD) are deposited over the MOS transistors. The ILD layers (e.g., first ILD layer 160 and second ILD layer 170) may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or other voids to further reduce their dielectric constant.

In some embodiments, the gate 122 is disposed in the first ILD layer 160 and the contacts (e.g., source terminal 116 and drain terminal 118) are formed/disposed in the second ILD layer 160 and the first ILD layer 160, as depicted.

As can be seen in the cross-section side view of FIG. 2, portions of each of the source terminal 116, the drain terminal 118, and the gate 120 may be disposed above and below the first channel layer 108 and the second channel layer 112 in some embodiments. According to various embodiments, the source terminal 116 is configured to surround, in at least one planar dimension, material of the first and/or second channel layers 108, 112. For example, material of the source terminal 116 may wrap around the first channel layer 108 to completely surround the channel material. Similarly, the drain terminal 118 and the gate 120 may be configured to surround, in at least one planar dimension, material of the first and/or second channel layers 108, 112. In some embodiments, the planar dimension may be perpendicular to a planar surface of the semiconductor substrate 102 upon which the IC device 100 is formed (e.g., the planar dimension being in and out of the page at cross-section line CD of FIG. 1).

Figure 3:
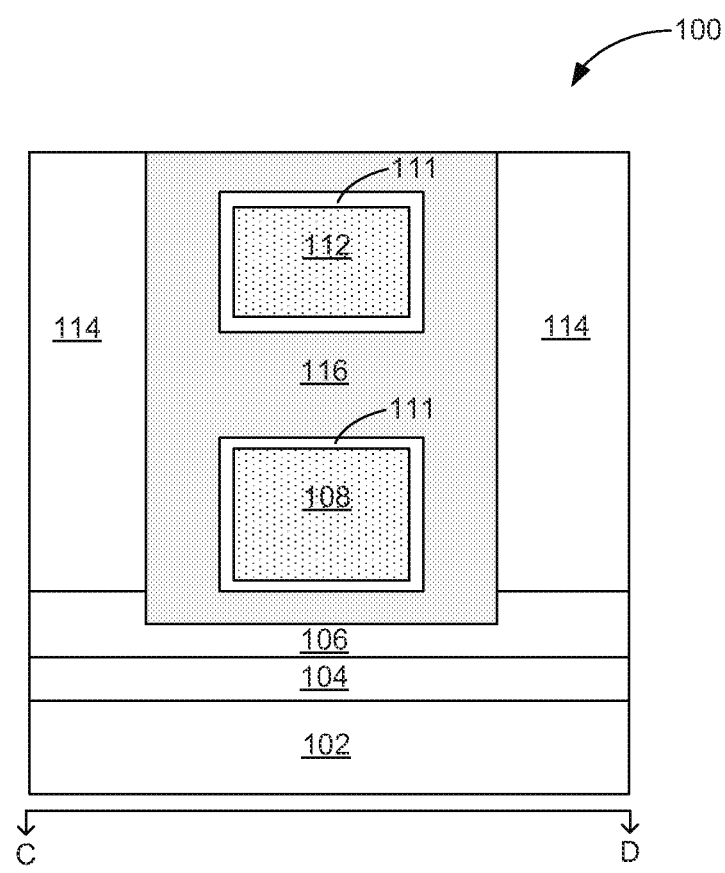
FIG. 3 schematically illustrates a cross-section side view across a fin structure of the integrated circuit device, in accordance with some embodiments.

FIG. 3 schematically illustrates a cross-section side view across a fin structure (e.g., fin structure 105 of FIG. 1) of the IC device 100, in accordance with some embodiments. For example, the cross-section side view may represent a view along line CD of FIG. 1. The cross-section side view shows how material of a contact (e.g., source terminal 116) may be positioned to surround material of the first and/or second channel layers 108, 112 in the plane of the cross-section. It is noted that although FIG. 3 only depicts a cross-section view through the source terminal 116, the same or similar configuration may be used for the drain terminal 118 or the gate 120 relative to the first and/or second channel layers 108, 112.

According to various embodiments, an epitaxial film 111 may be formed on the first and/or second channel layers 108, 112. The epitaxial film 111 may be epitaxially coupled with the first and/or second channel layers 108, 112 and may be configured to surround, in the at least one planar dimension, the material of the first and/or second channel layers 108, 112, as can be seen. The epitaxial film 111 may be disposed between the material of the channel layers and the material of the contact (e.g., source terminal 116 or drain terminal 118 of FIG. 2). The material of the contact may be deposited to encapsulate or substantially encapsulate the epitaxial film 111. The epitaxial film 111 may provide additional surface area between the material (e.g., semiconductor) of the first and/or second channel layers 108, 112 and the material (e.g., metal) of the contact, which may reduce external resistance (Rext) of the IC device 100.

The epitaxial film 111 may include a variety of suitable materials including, for example, semiconductor materials. In an embodiment where the channel layer (e.g., 108 or 112) is composed of a group nanowire material, the epitaxial film 111 may include an n-doped material such as indium gallium arsenide (InGaAs), indium antimonide (InSb), gallium arsenide (GaAs), and the like. In an embodiment where the channel layer is composed of a germanium (Ge) nanowire material, the epitaxial film 111 may include a p-doped material such as silicon germanium (SiGe), germanium (Ge), germanium antimonide (GeSb), and the like. In an embodiment where the channel layer is composed of a silicon (Si) nanowire material, the epitaxial film 111 may include an undoped, n-doped, or p-doped material such as silicon germanium (SiGe), silicon (Si), and the like. The epitaxial film 111 may have a thickness ranging from 50 Angstroms to 1000 Angstroms. The epitaxial film 111 may include other materials and/or thicknesses in other embodiments.

Figure 4:
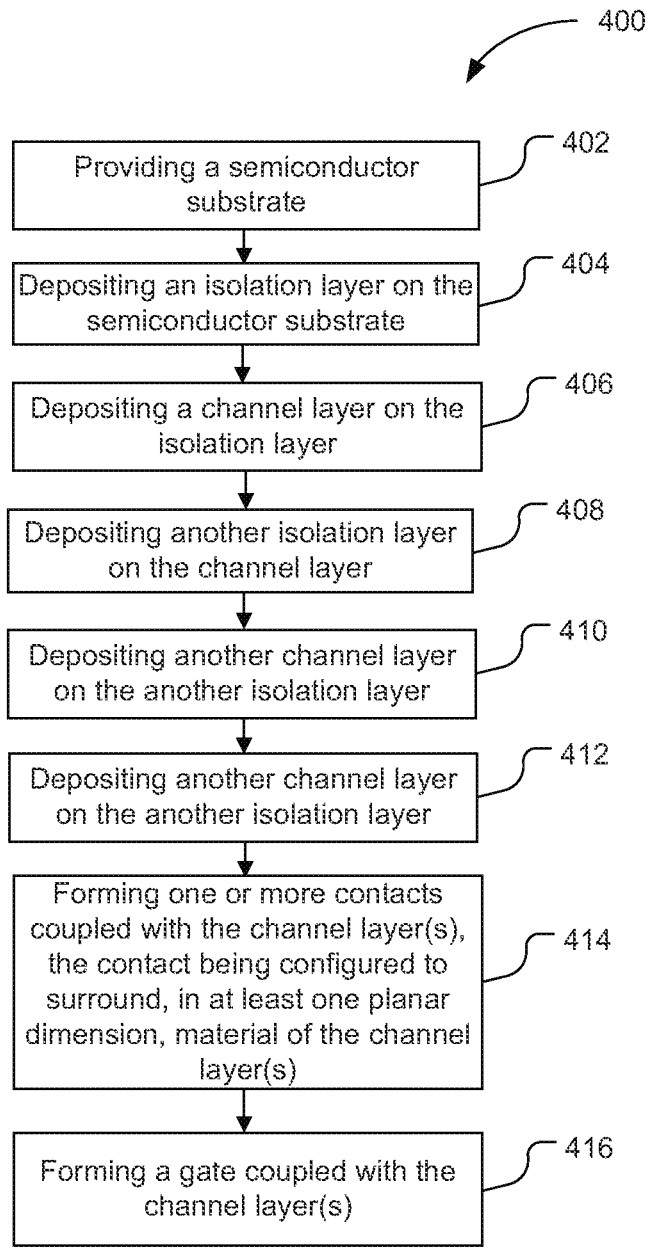
FIG. 4 is a flow diagram for a method of fabricating an integrated circuit device, in accordance with some embodiments.

FIG. 4 is a flow diagram for a method 400 of fabricating an IC device (e.g., the IC device 100 of FIGS. 1-3), in accordance with some embodiments. At 402, the method includes providing a semiconductor substrate (e.g., semiconductor substrate 102 of FIGS. 2-3).

At 404, the method 400 may further include depositing an isolation layer (e.g., first isolation layer 106 of FIG. 2) on the semiconductor substrate. In some embodiments, the isolation layer is deposited on a buffer layer (e.g., buffer layer 101 of FIG. 2) formed on the semiconductor substrate. In other embodiments where a buffer layer is not used, the isolation layer may be deposited on the semiconductor substrate.

At 406, the method 400 may further include depositing a channel layer (e.g., first channel layer 108 of FIG. 2) on the isolation layer. The isolation layer and the channel layer may be deposited by an epitaxial deposition process such that the isolation layer is epitaxially coupled with the material upon which it is deposited and the channel layer is epitaxially coupled with the isolation layer. According to various embodiments where a single channel layer is used for an IC device, the method 400 may skip actions at 408 and 410 and one or more contacts may be formed at 416 and coupled with the channel layer formed at 406.

At 408, the method 400 may further include depositing another isolation layer (e.g., second isolation layer 110 of FIG. 2) on the channel layer and, at 410, depositing another channel layer on the other isolation layer. Actions at 408 and 410 may be performed when multiple channel layers (e.g., second channel layer 112 of FIG. 2) are used to form the IC device. Actions at 408 and 410 may be repeated to provide a desired plurality of channel layers for the IC device. The other isolation layer and the other channel layer may be epitaxially deposited and may be epitaxially coupled together. The layers deposited at 404, 406, 408, and 410 may be epitaxially deposited to form a stack of layers.

At 412, the method 400 may further include forming one or more fin structures (e.g., fin structure 105). The stack of layers formed at 404 and 406 (and possibly at 408 and 410) may be patterned using, for example, lithography and/or etch patterns to provide one or more fin structures having at least the channel layer formed at 406 and, in some embodiments, further including the isolation and channel layers formed at 408 and 410. The patterning may include, for example, lithography and/or etch processes that define a pattern for the fin structures and remove material of the stack of layers according to the pattern to provide the fin structures. In some embodiments, the one or more fin structures may further include the isolation layer formed at 404. Three-dimensional (3D) transistor structures of the IC device may be formed using the one or more fin structures. An electrically insulative material (e.g., ILD material 114 of FIGS. 1-3) may be deposited to facilitate patterning processes and/or to electrically isolate components of the IC device.

At 414, the method 400 may further include forming one or more contacts (e.g., source terminal 116 of FIGS. 1-3 and/or drain terminal 118 of FIGS. 1-2) coupled with the channel layer(s), the contact being configured to surround, in at least one planar dimension, material of the channel layer(s). The one or more contacts may be formed using patterning processes such as lithography and/or etch processes. In some embodiments, the one or more contacts may be formed by selectively removing material of the isolation layer (e.g., of the one or more fin structures) using a selective etch process. For example, etch chemistries may be used that remove material of the ILD material and deposited isolation layer(s) but not the deposited channel layer(s). In some embodiments, an epitaxial film (e.g., epitaxial film 111 of FIG. 3) may be epitaxially deposited on the exposed material of the channel layer(s). Electrically conductive material (e.g., a metal) may be deposited to replace the removed material of the isolation layer to from the one or more contacts. In some embodiments, material of the contacts may be deposited directly on the material of the channel layers. In other embodiments where an epitaxial film is used, material of the contacts may be deposited directly on the material of the epitaxial film.

At 416, the method 400 may further include forming a gate (e.g., gate 120 of FIGS. 1-2) coupled with the channel layer(s). The gate may be formed according to any suitable process including, for example, a replacement metal gate (RMG) flow, which may include, for example, use of an intermediate dummy (e.g., temporary) gate material. In some embodiments, after dummy gate liftout, material of the isolation layer(s) may be selectively removed by an etch process (e.g., leaving the channel layer(s)) in the gate region and replaced with a high-k/metal gate stack. The gate material may be deposited to surround, in at least one planar dimension, material of the channel layer(s) similar to the contacts. The method 400 may comport with embodiments described in connection with FIGS. 1-3.

Figure 5:
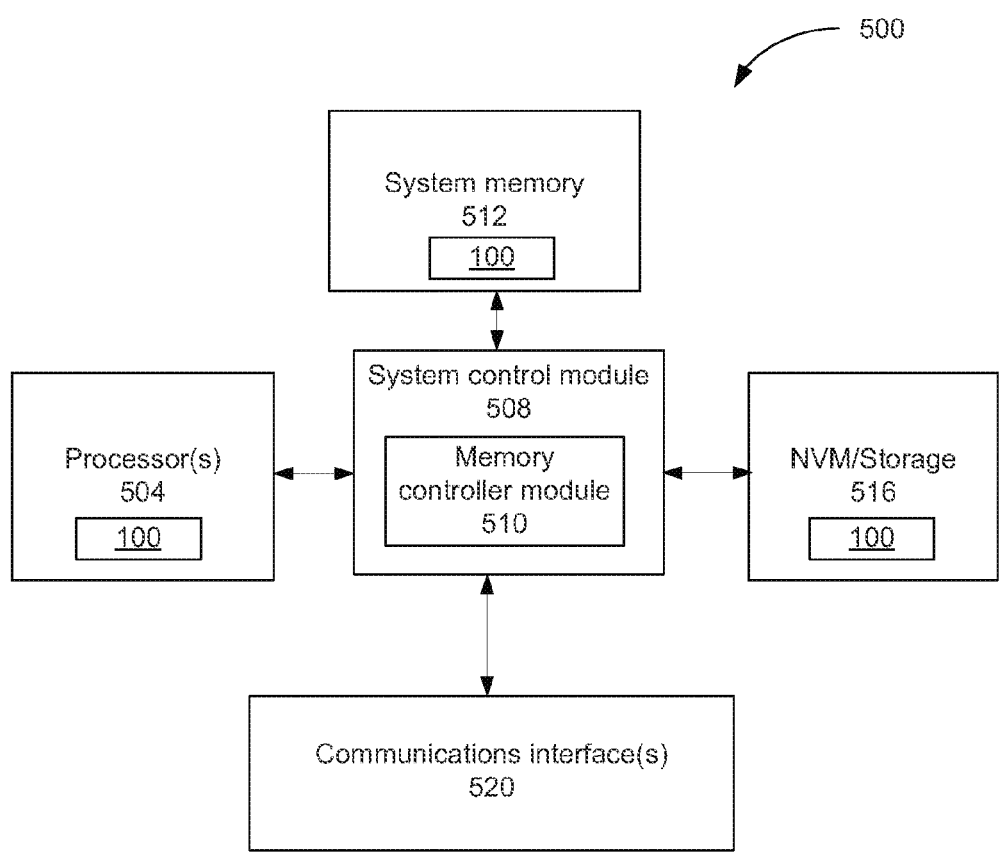
FIG. 5 schematically illustrates an example system that may include an integrated circuit device described herein in accordance with some embodiments.

Embodiments of the present disclosure may be implemented into a system using any suitable hardware and/or software to configure as desired. FIG. 5 schematically illustrates an example system that may include an integrated circuit device (e.g., IC device 100 of FIGS. 1-3) described herein in accordance with some embodiments.

In one embodiment, the system 500 includes one or more processor(s) 504. The system 500 may further include system control module 508 coupled with at least one of the processor(s) 504, system memory 512 coupled with system control module 508, non-volatile memory (NVM)/storage 516 coupled with system control module 508, and one or more communications interface(s) 520 coupled with system control module 508. In some embodiments, at lease one of the one or more processor(s) 504 may include an integrated circuit device e.g., IC device 100 of FIGS. 1-3) described herein.

System control module 508 for one embodiment may include any suitable interface controller(s) to provide for any suitable interface to at least one of the processor(s) 504 and/or to any suitable device or component in communication with system control module 508.

System control module 508 may include a memory controller module 510 to provide an interface to system memory 512. The memory controller module 510 may be a hardware module, a software module, and/or a firmware module.

System memory 512 may be used to load and store data and/or instructions, for example, for system 500. System memory 512 for one embodiment may include any suitable volatile memory, such as suitable Dynamic Random Access Memory (DRAM), for example. In some embodiments, the system memory 512 may include an IC device as described herein (e.g., IC device 100 of FIGS. 1-3).

System control module 508 for one embodiment may include one or more input/output (I/O) controller(s) to provide an interface to NVM/storage 516 and communications interface(s) 520.

The NVM/storage 516 may be used to store data and/or instructions, for example. NVM/storage 516 may include any suitable non-volatile memory, such as Phase Change Memory (PCM) or flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example. In some embodiments, the NVM/storage 516 may include an IC device as described herein (e.g., IC device 100 of FIGS. 1-3).

The NVM/storage 516 may include a storage resource physically part of a device on which the system 500 is installed or it may be accessible by, but not necessarily a part of, the device. For example, the NVM/storage 516 may be accessed over a network via the communications interface(s) 520.

Communications interface(s) 520 may provide an interface for system 500 to communicate over one or more wired or wireless network(s) and/or with any other suitable device.

For one embodiment, at least one of the processor(s) 504 may be packaged together with logic for one or more controller(s) of system control module 508, e.g., memory controller module 510. For one embodiment, at least one of the processor(s) 504 may be packaged together with logic for one or more controllers of system control module 508 to form a System in Package (SiP). For one embodiment, at least one of the processor(s) 504 may be integrated on the same die with logic for one or more controller(s) of system control module 508. For one embodiment, at least one of the processor(s) 504 may be integrated on the same die with logic for one or more controller(s) of system control module 508 to form a System on Chip (SoC).

In various embodiments, the system 500 may be, but is not limited to, a server, a workstation, a desktop computing device, or a mobile computing device (e.g., a laptop computing device, a handheld computing device, a handset, a tablet, a smartphone, a netbook, etc.). In various embodiments, the system 500 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method, comprising:
  providing a semiconductor substrate;
  depositing an isolation layer on the semiconductor substrate;
  depositing a channel layer on the isolation layer, the channel layer to provide a channel for a transistor;
  forming a contact coupled with the channel layer, the contact being configured to surround, in at least one planar dimension, material of the channel layer and to provide a source terminal or drain terminal for the transistor; and
  depositing an epitaxial film on and epitaxially coupled with the channel layer, the epitaxial film surrounding, in the at least one planar dimension, material of the channel layer and being disposed between the material of the channel layer and material of the contact, wherein the material of the channel layer includes N-type or P-type semiconductor material and the epitaxial film includes a group III-V semiconductor material and has a thickness between 50 Angstroms and 1000 Angstroms.

2. The method of claim 1, wherein the at least one planar dimension is substantially perpendicular to a planar surface of the semiconductor substrate upon which the transistor is formed.

3. The method of claim 1, further comprising:
  depositing a buffer layer on the semiconductor substrate, wherein the buffer layer is disposed between the semiconductor substrate and the isolation layer.

4. The method of claim 1, wherein depositing the channel layer comprises epitaxially depositing the channel layer on the isolation layer.

5. The method of claim 4, wherein forming the contact comprises:
  selectively removing material of the isolation layer using an etch process; and
  depositing a metal to replace the selectively removed material of the isolation layer to form the contact.

6. The method of claim 5, wherein forming the contact further comprises:
  epitaxially depositing the epitaxial film on the channel layer prior to depositing the metal to form the contact.

7. The method of claim 1, wherein:
  the epitaxial film includes a P-type material;
  the material of the channel layer includes germanium (Ge) nanowire material; and
  the isolation layer includes silicon germanium (SiGe).

8. The method of claim 1, wherein the isolation layer is a first isolation layer and the channel layer is a first channel layer, the method further comprising:

depositing a second isolation layer on the first channel layer; and depositing a second channel layer on the second isolation layer, wherein the contact is coupled with the second channel layer and configured to surround, in the at least one planar dimension, material of the second channel layer.

9. The method of claim 8, wherein the contact is a source terminal, the method further comprising:

forming a drain terminal coupled with the first channel layer and the second channel layer, the drain terminal being configured to surround, in the at least one planar dimension, material of the first channel layer and material of the second channel layer; and forming a gate coupled with the first channel layer and the second channel layer, the gate being disposed between the source terminal and the drain terminal and configured to control current flow of the transistor between the source terminal and the drain terminal.

10. The method of claim 8, further comprising:

depositing an interlayer dielectric (ILD) on the second channel layer.

* * * * *